US008416117B2

(12) United States Patent
Pedersen

(10) Patent No.: US 8,416,117 B2
(45) Date of Patent: Apr. 9, 2013

(54) ANALOG TO DIGITAL CONVERTER WITH DUAL INTEGRATING CAPACITOR SYSTEMS

(75) Inventor: Trond Pedersen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 60 days.

(21) Appl. No.: 13/208,254

(22) Filed: Aug. 11, 2011

(65) Prior Publication Data
US 2013/0038476 A1 Feb. 14, 2013

(51) Int. Cl.
H03M 1/12 (2006.01)
(52) U.S. Cl. ............. 341/172; 341/33; 341/34; 341/155
(58) Field of Classification Search ............. 341/33, 341/34, 155, 172; 345/173
See application file for complete search history.

(56) References Cited

U.S. PATENT DOCUMENTS

| 6,166,367 | A * | 12/2000 | Cho ........................... 250/208.1 |
| 6,587,143 | B1 * | 7/2003 | Boisvert ........................ 348/241 |
| 7,663,607 | B2 | 2/2010 | Hotelling | |
| 7,782,243 | B1 * | 8/2010 | Lu ................................. 341/172 |
| 7,875,814 | B2 | 1/2011 | Chen | |
| 7,920,129 | B2 | 4/2011 | Hotelling | |
| 7,948,477 | B2 * | 5/2011 | Hotelling ..................... 345/173 |
| 8,031,094 | B2 | 10/2011 | Hotelling | |
| 8,031,174 | B2 | 10/2011 | Hamblin | |
| 8,040,326 | B2 | 10/2011 | Hotelling | |
| 8,049,732 | B2 * | 11/2011 | Hotelling et al. ............. 345/173 |
| 8,179,381 | B2 | 5/2012 | Frey | |
| 2009/0315854 | A1 | 12/2009 | Matsuo | |
| 2012/0242588 | A1 | 9/2012 | Myers | |
| 2012/0242592 | A1 | 9/2012 | Rothkopf | |
| 2012/0243151 | A1 | 9/2012 | Lynch | |
| 2012/0243719 | A1 | 9/2012 | Franklin | |

FOREIGN PATENT DOCUMENTS
WO WO 2012/129247 9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

Primary Examiner — Khai M Nguyen
(74) Attorney, Agent, or Firm — Baker Botts LLP

(57) ABSTRACT

In one embodiment, an apparatus comprises a first capacitor system and a second capacitor system. Each capacitor system is removably coupled to the same portion of an analog to digital converter (ADC) and the same sensing circuit. Each capacitor system stores charge received through the sensing circuit when coupled to the sensing circuit and provides the charge received through the sensing circuit to the ADC for conversion into a digital value when coupled to the ADC. When the control signals are in a first state, the first capacitor system receives charge through the sensing circuit and the second capacitor system is coupled to the portion of the ADC. When the one or more control signals are in a second state, the second capacitor system is coupled to the sensing circuit to receive charge through the sensing circuit and the first capacitor system is coupled to the portion of the ADC.

21 Claims, 5 Drawing Sheets

ANALOG TO DIGITAL CONVERTER WITH DUAL INTEGRATING CAPACITOR SYSTEMS

TECHNICAL FIELD

This disclosure generally relates to analog to digital converters.

BACKGROUND

An analog to digital converter (ADC) is a device that converts a continuous quantity to a discrete time digital representation. For example, an ADC may be an electronic device that converts an input analog voltage or current to a digital number proportional to the magnitude of the voltage or current. Typically, an input voltage may be stored on one or more sampling capacitors of the ADC before it is converted to a digital number. An ADC may use any suitable coding scheme for its output, such as a two's complement binary number or a Gray code.

DESCRIPTION OF EXAMPLE EMBODIMENTS

Figure 1:
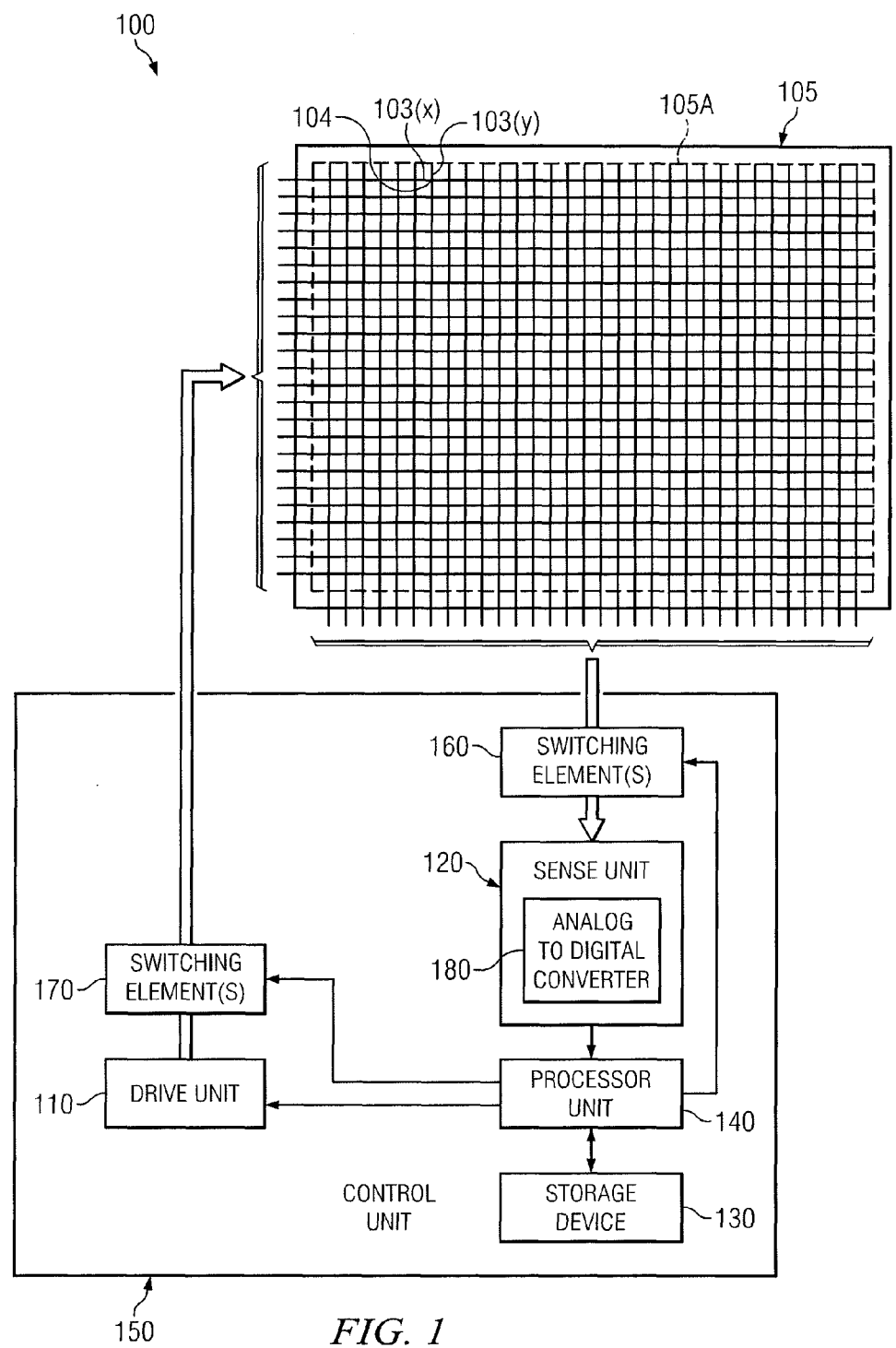
FIG. 1 illustrates an example system comprising a capacitive touch sensor coupled to a control unit that includes an analog to digital converter (ADC).

FIG. 1 illustrates an example of a system 100 comprising a capacitive touch sensor 105 coupled to a control unit 150. Capacitive touch sensor 105 of system 100 may include a screen comprising an insulator coated with a transparent conductor in a particular pattern. When a finger or other object touches the surface of the screen, there is a change in capacitance. A signal indicating this change in capacitance may be sent to control unit 150 for processing to determine the position of the touch. In various embodiments, system 100 is operable to process measurements of any suitable type of capacitance, such as surface capacitance, projected capacitance, mutual capacitance, and self or absolute capacitance.

As depicted, capacitive touch sensor 105 includes sensing area 105A. Drive electrodes 103(x) and sense electrodes 103(y) may be formed in the sensing area 105A on one or more substrates. As depicted, the drive electrodes 103(x) run in a horizontal direction and the sense electrodes 103(y) run in a vertical direction. However, the sense and drive electrodes may have any suitable shape and arrangement. Capacitive sensing channels 104 may be formed in the sensing area at the regions where edges of the drive electrodes 103(x) and sense electrodes 103(y) are adjacent. In certain embodiments, drive electrodes 103(x) and sense electrodes 103(y) are arranged in electrical isolation from each other. For example, the drive electrodes 103(x) and the sense electrodes 103(y) of capacitive touch sensor 105 may be arranged on opposite surfaces of an insulating substrate so that the substrate provides electrical isolation between the drive and sense electrodes.

The control unit 150 of system 100 may be in communication with the capacitive touch sensor 105. As depicted, the control unit 150 includes a drive unit 110, a sense unit 120, a storage device 130, and a processor unit 140. The storage device 130 may store programming in a computer-readable storage medium for execution by the processor unit 140 and data used in or resulting from operations of the processor unit 140. In some embodiments, the control unit 150 is an integrated circuit chip such as a general purpose microprocessor, a microcontroller, a programmable logic device/array, an application-specific integrated circuit (ASIC), or a combination thereof. In other embodiments, the drive unit 110, the sense unit 120, and/or the processor unit 140 may be provided in separate control units.

The processor unit 140 controls the drive unit 110 to supply drive signals (such as electrical pulses) to the drive electrodes 103(x), so as to induce charge on the sense electrodes 103(y) that intersect with the drive electrodes 103(x). The sense unit 120 senses charge at the various intersections 104 via the sense electrodes 103(y), and the sense unit 120 provides measurement signals representing node capacitance to the processor unit 140. In the embodiment depicted, sense unit 120 includes one or more analog to digital converters (ADCs) 180 operable to convert the signals representing node capacitance to digital values that are sent to processor unit 140.

In the embodiment depicted, the drive electrodes 103(x) connect to the drive unit 110 via one or more first switching elements 170 and the sense electrodes 103(y) connect to the sense unit 120 via one or more second switching elements 160. The switching elements 160 and 170 are controlled by the processor unit 140. In a particular embodiment, the processor unit 140 controls the switching elements 160 and 170 and the drive and sense units 110 and 120 to implement sensing at all of the intersections 104 on the sensing area 105A and provide full sensing resolution. Each drive electrode 103(x) may be driven, and signals from each sense electrode 103(y) may be sensed. In a different embodiment, the processor unit 140 controls the switching elements 160 and 170 and the drive and sense units 110 and 120 to drive and sense via a smaller number of channels. Selected subsets of the drive and sense electrodes may be used. In this example, the drive signals are applied to groups of drive electrodes 103(x) forming a smaller number of drive channels, and signals are sensed from groups of sense electrodes 103(y) forming a smaller number of sense channels.

In a particular embodiment, the processor unit 140 is capable of processing data received from the sense unit 120 and determining the presence and location of a touch on the capacitive touch sensor 105. In a particular embodiment, the presence and location of a touch on the capacitive touch sensor 105 may be determined by detecting a change in capacitance of one or more capacitive sensing channels 104 of the capacitive touch sensor. In some embodiments, the capacitance of one or more capacitive sensing channels 104 may be sampled periodically in order to determine whether the capacitances of the channels have changed. In some embodiments, the capacitance of one or more capacitive sensing channels 104 is sampled by ADC 180.

In typical ADC systems, one or more sampling capacitors of the ADC are operable to receive charge from one or more integrating capacitors that are coupled to the ADC. The one or more integrating capacitors measure a value for a period of time by storing a charge corresponding to the value. After the period of time is over, the charge on the integrating capacitors is transferred to the one or more sampling capacitors of the ADC. The charge in the sampling capacitors of the ADC is then converted to a digital value. In some systems, the integrating capacitors may measure a new value while the ADC is converting the charge stored on the sampling capacitors.

These typical systems have various drawbacks, including increased area for separate integrating and sampling capacitors, charge redistribution error resulting from the transfer of charge from the integrating capacitors to the sampling capacitors, and relatively slow operation since charge must be transferred from the integrating capacitors to the sampling capacitors before the ADC may begin the conversion process.

In some embodiments, ADC 180 comprises a first capacitor system and a second capacitor system. The first and second capacitor systems each comprise one or more capacitors. Each capacitor system is removably coupled to the same portion of ADC 180 and the same sensing circuit. Each capacitor system is configured to store an amount of charge received through the sensing circuit when coupled to the sensing circuit, and provide the amount of charge received through the sensing circuit to the ADC 180 for conversion into a digital value when coupled to the portion of the ADC 180. The ADC 180 may further comprise a timing circuit configured to generate one or more control signals and a switching circuit configured to receive the one or more control signals. When the one or more control signals are in a first state, the switching circuit couples the first capacitor system to the sensing circuit to receive charge through the sensing circuit and concurrently couples the second capacitor system to the portion of the ADC 180. When the one or more control signals are in a second state, the switching circuit couples the second capacitor system to the sensing circuit to receive charge through the sensing circuit and concurrently couples the first capacitor system to the portion of the ADC 180.

Figure 2A:
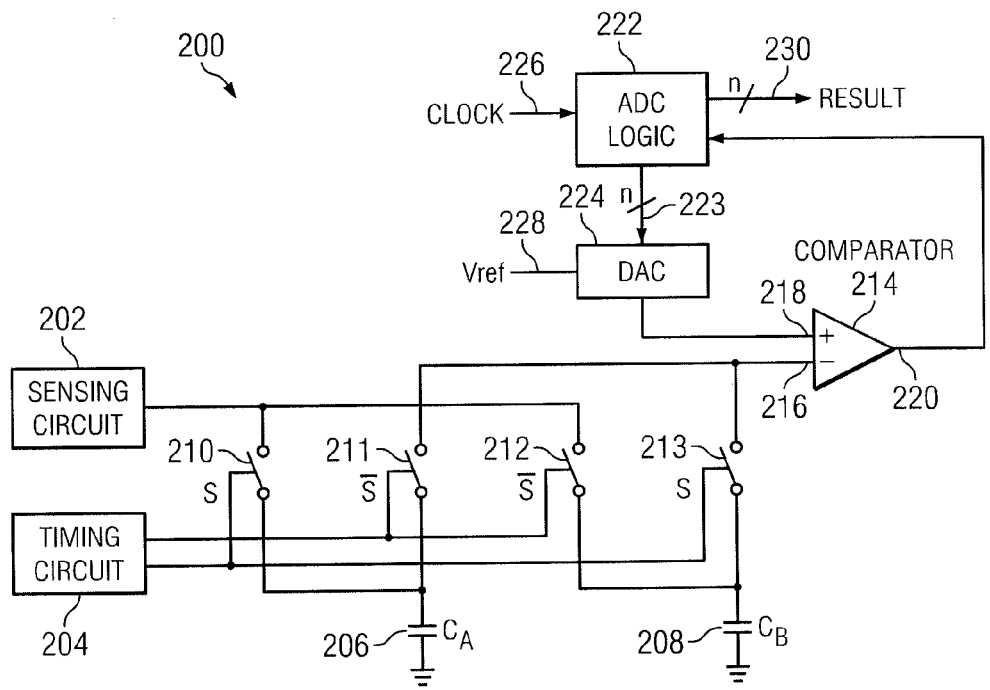
FIG. 2A illustrates an example embodiment of the ADC of FIG. 1.
Figure 2B:
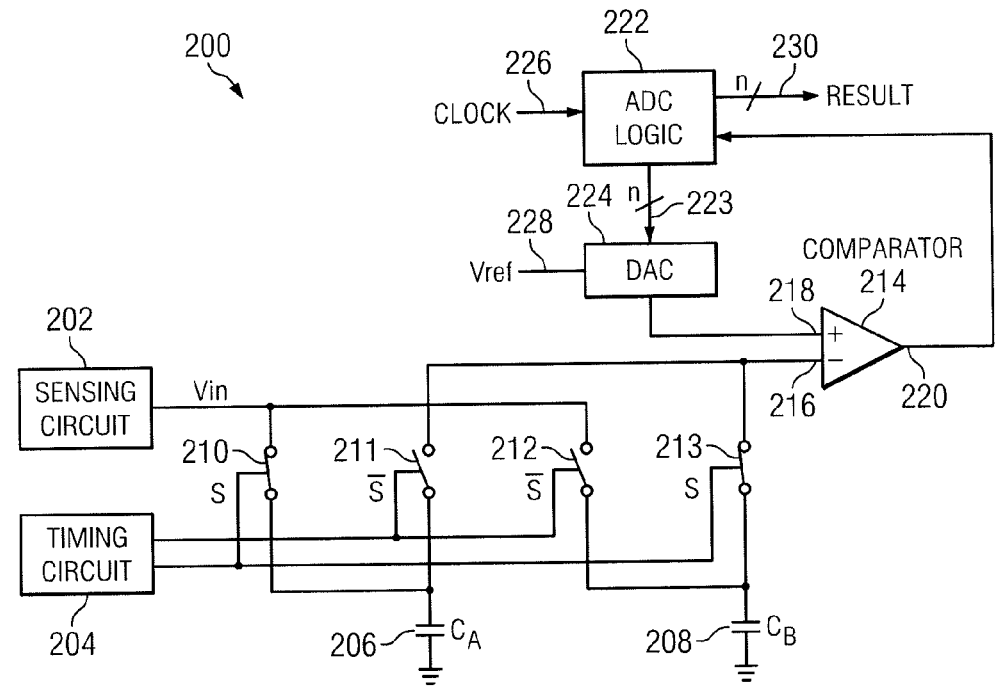
FIGS. 2B-2C illustrate example states of operation of the ADC of FIG. 2A.
Figure 2C:
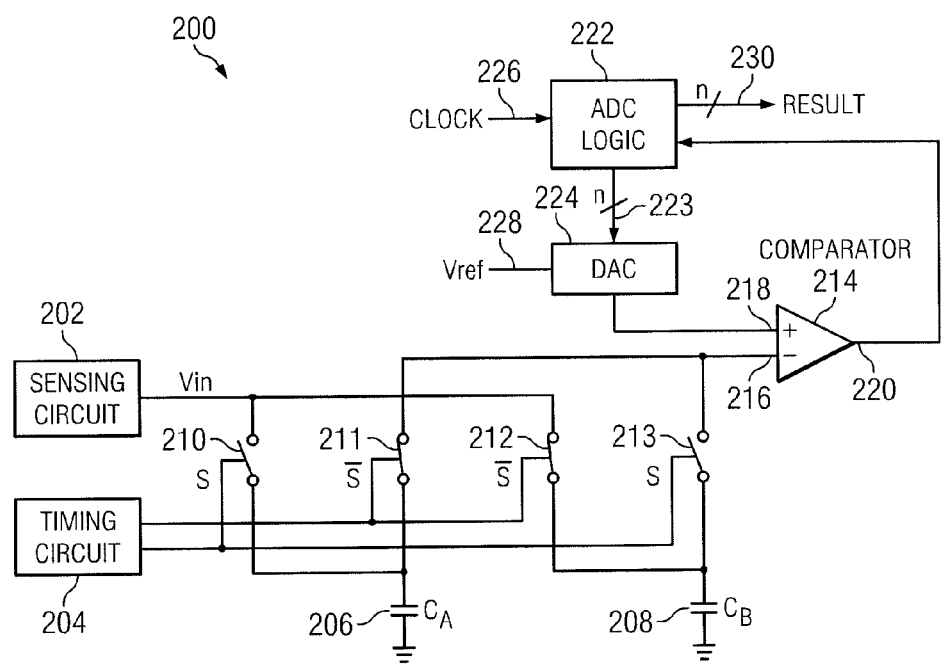
Figure 3:
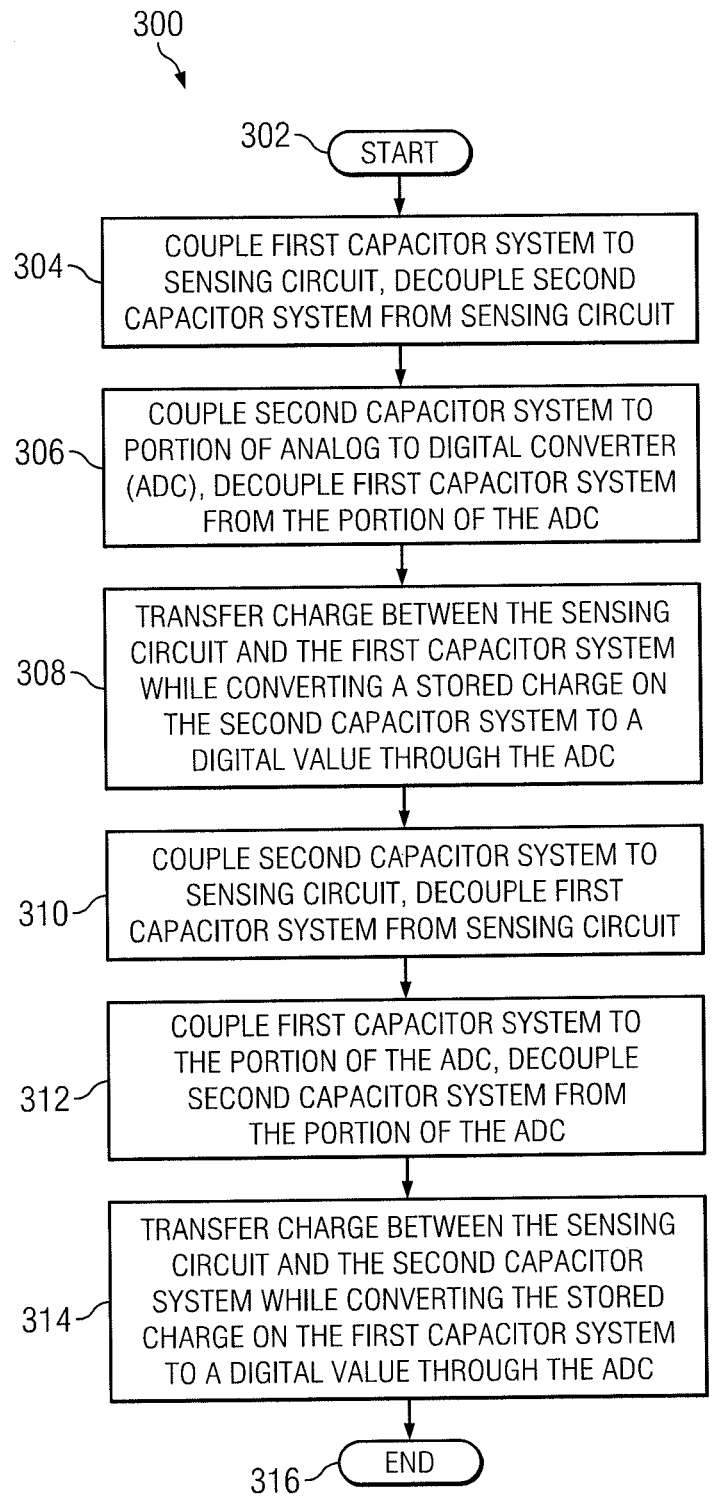
FIG. 3 illustrates an example method for alternating between capacitor systems of the ADC of FIG. 1.
Figure 4:
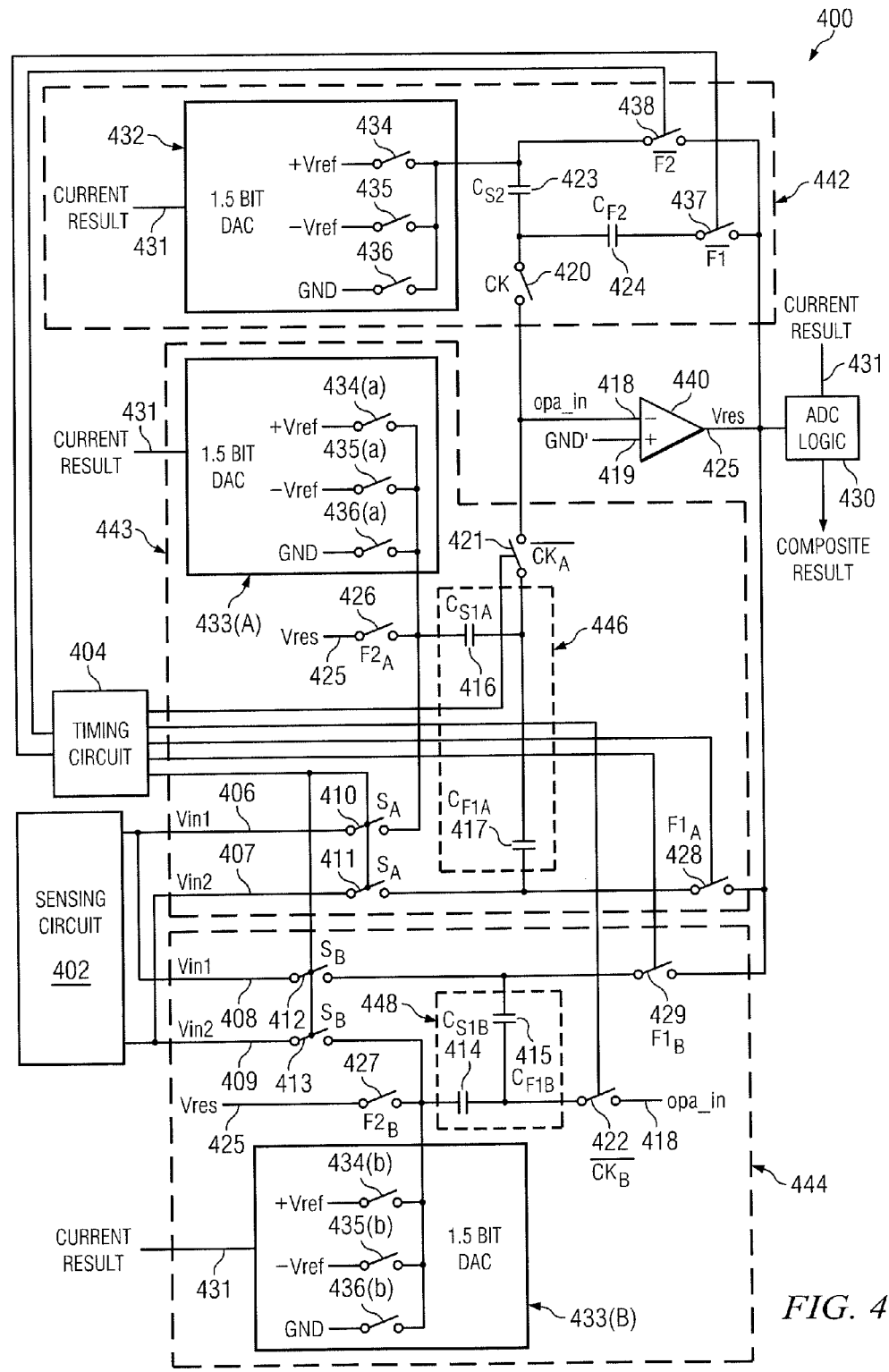
FIG. 4 illustrates an additional example embodiment of the ADC of FIG. 1.

FIG. 2A illustrates an example embodiment of ADC 180. FIGS. 2B-2C illustrate example states of operation of ADC 180. FIG. 3 illustrates an example method for alternating between capacitor systems of ADC 180 and FIG. 4 illustrates an additional example embodiment of ADC 180.

FIG. 2A illustrates an example system 200 that is an example embodiment of ADC 180. System 200 comprises an ADC with dual integrating capacitor systems 206 and 208. In certain embodiments, all or a portion of system 200 may reside within a capacitive touch sensor control unit, such as control unit 150 of FIG. 1. In particular embodiments, at least a portion of system 200 resides within a sense unit of a capacitive touch sensor control unit, such as sense unit 120 of control unit 150. In particular embodiments, the ADC of system 200 is configured to receive a signal indicative of a capacitance of a capacitive sense channel 104 of a capacitive touch sensor 105 and convert the signal to a digital value.

System 200 comprises a sensing circuit 202, a timing circuit 204, two capacitor systems 206 and 208, a series of switches 210-213, a comparator 214, ADC logic 222, and a digital to analog converter (DAC) 224. The two capacitor systems 206 and 208 are each operable to function as integrating and sampling capacitors. In some embodiments, capacitor system 206 may function as a sampling capacitor while capacitor 208 functions as an integrating capacitor and as an integrating capacitor while capacitor 208 functions as a sampling capacitor. Thus the ADC of system 200 includes dual integrating capacitors that also function as the sampling capacitors of the ADC. Accordingly, certain embodiments of the present disclosure may avoid various drawbacks associated with separate integrating and sampling capacitors.

Sensing circuit 202 may comprise any suitable circuitry for transmission of a signal to the capacitor systems 206 and 208 via switches 210 and 212 respectively. For example, sensing circuit 202 may comprise one or more receive pads, amplifiers, inverters, transmission lines, or other suitable circuitry. In a particular embodiment, sensing circuit 202 is coupled to a capacitive sensing channel 104 of a capacitive touch sensor 105 and is configured to transmit a signal that is indicative of a capacitance of an area of the capacitive touch sensor 105 (such as capacitive sensing channel 104) to the capacitor systems 206 and 208.

Capacitor systems 206 and 208 each comprise one or more capacitors operable to receive and store a signal from sensing circuit 202. In some embodiments, capacitor systems 206 and 208 may each comprise a plurality of capacitors coupled together in parallel. Capacitor systems 206 and 208 are each removably coupled to sensing circuit via switches 210 and 212 respectively. Capacitor systems 206 and 208 are each configured to store a signal received from sensing circuit 202 and provide the stored signal to a particular portion of the ADC for conversion of the stored signal into a digital value. In some embodiments, a signal from sensing circuit 202 may comprise an amount of charge. In a particular embodiment, the amount of charge may be indicative of a capacitance sensed by sensing circuit 202.

In some embodiments, capacitor systems 206 and 208 are each removably coupled to a particular portion of the ADC. In the embodiment depicted, capacitor systems 206 and 208 are each removably coupled to comparator 214, and more particularly, to the inverting input of comparator 214. As shown, switches 211 and 213 are directly connected to the comparator 214 and respectively couple capacitor system 206 and 208 to comparator 214.

Timing circuit 204 is coupled to switches 210-213 and is configured to generate one or more control signals that are sent to switches 210-213. For example, timing circuit 204 may send a signal S that is operable to close switches 210 and 213 when S is high and open the switches when S is low. Timing circuit 204 may also send a signal $\overline{S}$ that is operable to open switches 211 and 212 when $\overline{S}$ is high and close the switches when S is low. In some embodiments, $\overline{S}$ is an inverted version of the signal S.

Switches 210-213 may collectively comprise a switching circuit that is operable to receive one or more control signals from timing circuit 204. Based on the values of the received control signals, the switching circuit may couple the capacitor systems 206 and 208 to the appropriate elements of system 200. When the control signals received from timing circuit 204 are in a first state, the switching circuit may couple capacitor system 206 to the sensing circuit 202 and concurrently couple capacitor system 208 to the comparator 214. For example, as shown in FIG. 2B, when control signal S is high and control signal $\overline{S}$ is low, capacitor system 206 is coupled to the sensing circuit 202 by switch 210 and capacitor system 208 is coupled to the comparator 214 by switch 213. When the control signals received from timing circuit 204 are in a second state, the switching circuit may couple capacitor system 208 to the sensing circuit 202 and concurrently couple capacitor system 206 to the comparator 214. For example, as shown in FIG. 2C, when control signal S is low and control signal $\overline{S}$ is high, capacitor system 208 is coupled to the sensing circuit 202 by switch 212 and capacitor system 206 is coupled to the comparator 214 by switch 211. In some embodiments, the switching circuit may comprise a plurality of switches that temporarily couple one of the capacitor systems 206 or 208 to the sensing circuit 202 and the other capacitor system to comparator 214.

FIGS. 2B-2C are described further in connection with an example method 300 for alternating between capacitor systems of ADC 180. The method begins at step 302. At step 304, a first capacitor system is coupled to a sensing circuit and a second capacitor system is decoupled from the sensing circuit. For example, in FIG. 2B, capacitor system 206 is coupled to sensing circuit 202 by closed switch 210 and capacitor system 208 is decoupled from the sensing circuit via opened switch 212. At step 306, the second capacitor system is coupled to a portion of an ADC and the first capacitor system is decoupled from the portion of the ADC. For example, capacitor system 208 is coupled to comparator 214 via closed switch 213 and capacitor system 206 is decoupled from the comparator 214 via opened switch 211.

At step 308, charge is transferred between the sensing circuit and the first capacitor system while a stored charge on the second capacitor system is converted to a digital value by the ADC. For example, charge may be transferred between sensing circuit 202 and capacitor system 206 while a charge stored by capacitor system 208 is converted to a digital value by the ADC of system 200.

At step 310, a second capacitor system is coupled to a sensing circuit and a first capacitor system is decoupled from the sensing circuit. For example, in FIG. 2C, capacitor system 208 is coupled to sensing circuit 202 by closed switch 212 and capacitor system 206 is decoupled from the sensing circuit via opened switch 210. At step 312, the first capacitor system is coupled to the portion of an ADC and the second capacitor system is decoupled from the portion of the ADC. For example, capacitor system 206 is coupled to comparator 214 via closed switch 211 and capacitor system 208 is decoupled from the ADC via opened switch 213.

At step 314, charge is transferred from the sensing circuit to the second capacitor system while a stored charge on the first capacitor system is converted to a digital value by the ADC. For example, charge may be transferred between sensing circuit 202 and capacitor system 208 while a charge stored by capacitor system 206 is converted to a digital value by the ADC of system 200. The method ends at step 316.

During steps 308 and 314, any suitable ADC may convert the charge stored at capacitor systems 206 and 208 to digital values. For example, in FIG. 2, the ADC of system 200 is depicted as a successive approximation ADC. As another example, In FIG. 4, an algorithmic ADC is depicted.

Referring again to FIG. 2B, the ADC of system 200 comprises comparator 214, ADC logic 222, and DAC 224. Capacitor system 208 is coupled to comparator 214, and the ADC is operable to convert the amount of charge stored by capacitor system 208 into a digital value. For example, the amount of charge stored by capacitor system 208 may result in a voltage drop across capacitor system 208 that is converted into a digital value. Comparator 214 is operable to receive a voltage from DAC 224 and compare it against a voltage stored in capacitor system 208. The comparator output 220 feeds the result of this comparison to the ADC logic 222. ADC logic 222 is operable to store an n-bit binary value 223 that is provided to DAC 224. DAC 224 converts the n-bit binary value into an analog voltage based on a reference voltage $V_{ref}$ 228. The analog voltage is then provided to comparator 214 for comparison against a voltage from the capacitor system 208.

In a particular embodiment, in the first iteration of the analog to digital conversion, ADC logic will first output a binary value 223 with the most significant bit set to a digital 1 and each other bit set to a digital zero. Thus, if the ADC is an 8-bit ADC, the first digital value will be 1000000 (which corresponds to the decimal value 64). The DAC 224 receives this value and converts it to an analog voltage based on $V_{ref}$ 228. In this case, the analog voltage will be approximately ½ of $V_{ref}$, since the analog voltage is equal to $V_{ref}$ times the decimal value (64) of binary value 223 divided by the maximum decimal value (127) of binary value 223=Vref*64/127. The analog voltage is compared to the voltage stored by capacitor system 208. If the analog voltage from the DAC 224 is higher than the voltage stored by capacitor system 208, the most significant bit of binary value 223 is reset to 0, otherwise it stays set to 1. The next most significant bit of binary value 223 is set to 1, a corresponding analog voltage is generated by the DAC, the comparison is made, and the result is recorded by ADC logic 222. This process repeats for each bit of signal 223 until result 230 is obtained. Result 230 is the digital value corresponding to the voltage stored in capacitor system 208. A similar procedure may be performed by the ADC to convert a value stored in capacitor system 206 to a digital value.

Particular embodiments may provide one or more or none of the following technical advantages. Particular embodiments may provide an analog to digital converter with dual integrating capacitors. In particular embodiments, each integrating capacitor may also function as a sampling capacitor of the analog to digital converter. Particular embodiments may reduce the area required for sensing and converting voltages to digital values. Some embodiments reduce charge redistribution error resulting from the transfer of charge from integrating capacitors to the sampling capacitors. Particular embodiments speed up the operation of sampling and converting or increase the number of samples that may be converted in a given time.

FIG. 4 illustrates an example system 400 that is an example embodiment of ADC 180. System 400 comprises an ADC with dual integrating capacitor systems 446 and 448. In certain embodiments, all or a portion of system 400 may reside within a capacitive touch sensor control unit, such as control unit 150. In particular embodiments, at least a portion of system 400 resides within a sense unit of a capacitive touch sensor control unit, such as sense unit 120 of control unit 150. In particular embodiments, the ADC of system 400 is configured to receive a signal indicative of a capacitance of a capacitive sense channel 104 of a capacitive touch sensor 105 and convert the signal to a digital value.

System 400 comprises a sensing circuit 402, a timing circuit 404, two capacitor systems 446 and 448, switches 410-413, 420-422, 426-429, and 434-438, capacitors 423-424, a differential amplifier 440, ADC logic 430, and digital to analog converters (DACs) 432, 433(A), and 433(B). Sensing circuit 402 may comprise any suitable circuitry for transmission of a signal to the capacitor systems 446 and 448 via switches 410-413. For example, sensing circuit 402 may comprise one or more receive pads, amplifiers, inverters, transmission lines, or other suitable circuitry. In a particular embodiment, sensing circuit 402 is coupled to a capacitive sensing channel 104 of a capacitive touch sensor 105 and is configured to transmit a signal that is indicative of a capacitance of an area of the capacitive touch sensor 105 (such as capacitive sensing channel 104) to the capacitor systems 446 and 448. In a particular embodiment, sensing circuit 402 is operable to transmit on lines 406 and 408 a signal Vin1 that is induced by control unit 150 sending a positive (i.e., rising) edge of an electrical pulse to capacitive sense channel 104. Sensing circuit 402 is also operable to transmit on lines 407 and 409 a signal Vin2 that is induced by control unit 150 sending a negative (i.e., falling) edge of the electrical pulse to the capacitive sense channel 104. The sensing circuit 402 may include an inverter coupled to connections 407 and 409 such that the negative edge results in charge transferred to capacitor system 446 or 448.

In the embodiment depicted, capacitor systems 446 and 448 each comprise two capacitors operable to receive and store one or more signals received from sensing circuit 402. Capacitor system 446 is removably coupled to sensing circuit 402 via switches 410 and 411 and capacitor system 448 is removably coupled to the sensing circuit via switches 412 and 413. Capacitor systems 446 and 448 are each configured to store one or more signals received from sensing circuit 402 and provide the one or more stored signals to a particular portion of the ADC of system 400 for conversion of the stored signal into a digital value. In some embodiments, a signal from sensing circuit 402 may comprise an amount of charge. In a particular embodiment, the amount of charge may be indicative of a capacitance sensed by sensing circuit 402.

In some embodiments, capacitor systems 446 and 448 are each removably coupled to a particular portion of the ADC. In the embodiment depicted, capacitor systems 446 and 448 are each removably coupled to differential amplifier 440, and more particularly, to the inverting input of differential amplifier 440 via switches 421 and 422 respectively. Capacitor systems 446 and 448 are also each removably coupled to the output 425 of differential amplifier 440 via switches 428 and 429.

Timing circuit 404 is coupled to switches 410-413, 421-422, 428-429, and 437-438 and is configured to generate one or more control signals that are sent to these switches. Timing circuit 404 is operable to generate control signals having at least a first state and a second state. In the first state, the signals from timing circuit 404 close switches 410 and 411 to couple capacitor system 446 to the sensing circuit 402 and open switches 412 and 413 so that the second capacitor system 448 is not coupled to the sensing circuit 402. Concurrently, switches 421 and 426 are held open by the signals from timing circuit 404 so that the capacitor system 446 is not coupled to the differential amplifier 440 of the ADC and switches 422 and 427 are held closed to couple the capacitor system 448 to the differential amplifier. In some embodiments, switches 421, 422, 426, and 427 are also dependent on a clock signal CK that is coupled to switch 420. In particular embodiments, these switches do not close unless the clock signal CK is not active (or the complement $\overline{CK}$ of the clock signal CK is active).

While the control signals from timing circuit 404 are in the first state, charge may be transferred between sensing circuit 202 and capacitor system 446 while a charge stored by capacitor system 448 is converted to a digital value by the ADC of system 400. When the control signals from timing circuit 404 are in a second state, the signals from timing circuit 404 open switches 410 and 411 to decouple capacitor system 446 from the sensing circuit 402 and close switches 412 and 413 to couple the second capacitor system 448 to the sensing circuit 402. Concurrently, switches 421 and 426 may be closed (depending on the value of the clock signal CK) to couple the capacitor system 446 to the differential amplifier 440 of the ADC and switches 422 and 427 are held open to decouple the capacitor system 448 from the differential amplifier 440. In the second state, charge may be transferred between sensing circuit 402 and capacitor system 448 while a charge stored by capacitor system 446 is converted to a digital value by the ADC of system 400.

The ADC of system 400 is operable to convert the amount of charge stored by capacitor system 446 or 448 into a digital value. The operation will be described with respect to capacitor system 446. The ADC utilizes two stages to perform conversion. When capacitor system 446 is selected for conversion, stages 443 and 442 are used. When capacitor system 448 is selected for conversion, stages 444 and 442 are used.

The amount of charge stored by capacitor system 446 may result in a voltage drop across the capacitors 416 and 417 that is converted into a digital value by the ADC. When a $\overline{CK}$ signal is active, switch 421 closes and differential amplifier 440 is operable to amplify the voltage across capacitors 416 and 417. The amplified voltage may be termed an intermediate result of the analog to digital conversion and is stored in capacitors 423 and 424 of stage 442. Based on this amplified value, ADC logic 430 will determine a current result 431 and a portion of the composite result. When CK goes active, switch 421 will open and switch 420 will close. Current result 431 is fed to DAC 432 of stage 442. DAC 432 then applies a voltage selected from 434, 435, and 436 based on the value of current result 431. This voltage and the voltage stored in capacitors 423 and 424 is amplified by the differential amplifier 440. The resulting voltage (a second intermediate result) is stored in capacitor system 446 of stage 443. ADC logic 430 will determine a new current result 431 and an additional portion of the composite result based upon the resulting voltage. This new current result 431 is fed to DAC 433(A) of stage 443. DAC 433(A) then applies a voltage selected from 434 (A), 435(A), and 436(A) based on the value of the current result 431. The voltage applied by DAC 433(A), along with the voltage stored in capacitor system 446 is then amplified by differential amplifier 440 and the resulting voltage is stored in capacitors 423 and 424. A new current result 431 and additional portion of the composite result is determined by ADC logic 430. System 400 continues in this manner, switching between stages 442 and 443 until the conversion is complete and a composite result indicating a digital value of the initial voltage level stored in capacitor system 446 is obtained.

In some embodiments, one of the DACs 433(A) and 433 (B) may be eliminated by sharing the other DAC between the stages 443 and 444. For example, DAC 433(A) may be shared by stages 443 and 444 as follows. When the ADC is converting a value stored by capacitor system 446 of stage 443, the DAC 433(A) may selected to be used by stage 443. When the ADC is converting a value stored by capacitor system 448 of stage 444, the DAC 433(B) may be used by stage 444.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. An apparatus comprising:
a first capacitor system and a second capacitor system, each capacitor system comprising one or more capacitors, each capacitor system removably coupled to the same portion of an analog to digital converter (ADC) and the same sensing circuit, each capacitor system configured to store an amount of charge received through the sensing circuit when coupled to the sensing circuit, and provide the amount of charge received through the sensing circuit to the ADC for conversion into a digital value when coupled to the portion of the ADC;
a timing circuit configured to generate one or more control signals; and
a switching circuit configured to:
receive the one or more control signals;
when the one or more control signals are in a first state, couple the first capacitor system to the sensing circuit to receive charge through the sensing circuit and concurrently couple the second capacitor system to the portion of the ADC; and
when the one or more control signals are in a second state, couple the second capacitor system to the sensing circuit to receive charge through the sensing circuit and concurrently couple the first capacitor system to the portion of the ADC.

2. The apparatus of claim 1, wherein:
the sensing circuit is coupled to a capacitive touch sensor; and
the amount of charge is indicative of a measured capacitance of an area of the capacitive touch sensor.

3. The apparatus of claim 1, the switching circuit comprising:
a first switch system comprising one or more switches operable to couple the first capacitor system to the sensing circuit;
a second switch system comprising one or more switches operable to couple the first capacitor system to the portion of the ADC;
a third switch system comprising one or more switches operable to couple the second capacitor system to the sensing circuit; and
a fourth switch system comprising one or more switches operable to couple the second capacitor system to the portion of the ADC.

4. The apparatus of claim 3, wherein the switching circuit is configured to:
hold each switch of the first switch system and the fourth switch system closed while concurrently holding each switch of the second switch system and the third switch system open; and
hold each switch of the second switch system and the third switch system closed while concurrently holding each switch of the first switch system and the fourth switch system open.

5. The apparatus of claim 3, wherein:
each switch of the second switch system and the fourth switch system is directly connected to a differential amplifier of the ADC.

6. The apparatus of claim 1, wherein:
the first capacitor system and the second capacitor system are each operable to store an intermediate result from a differential amplifier of the ADC.

7. The apparatus of claim 1, the ADC comprising:
a digital to analog converter (DAC) that is removably coupled to the first capacitor system and the second capacitor system, the DAC configured to be coupled to:
the first capacitor system for at least a portion of a first time period in which the ADC converts charge stored by the first capacitor system to the first digital value; and
the second capacitor system for at least a portion of a second time period in which the ADC converts charge stored by the second capacitor system to the second digital value.

8. A method comprising:
generating one or more control signals;
when the one or more control signals are in a first state:
coupling a first capacitor system comprising one or more capacitors to a sensing circuit;
coupling a second capacitor system comprising one or more capacitors to a portion of an analog to digital converter (ADC);
storing, by the first capacitor system, a first amount of charge received through the sensing circuit;
providing, by the second capacitor system, a second amount of charge to the ADC for conversion into a first digital value; and
when the one or more control signals are in a second state:
coupling the second capacitor system to the sensing circuit;
coupling the first capacitor system to the portion of the ADC;
storing, by the second capacitor system, a third amount of charge received through the sensing circuit; and
providing, by the first capacitor system, the first amount of charge to the ADC for conversion into a second digital value.

9. The method of claim 8, wherein:
the sensing circuit is coupled to a capacitive touch sensor; and
the first, second, and third amounts of charge are each indicative of a capacitance of an area of the capacitive touch sensor.

10. The method of claim 8, wherein:
the first capacitor system is coupled to the sensing circuit by a first switch system comprising one or more switches;
the first capacitor system is coupled to the portion of the ADC by a second switch system comprising one or more switches;
the second capacitor system is coupled to the sensing circuit by a third switch system comprising one or more switches; and
the second capacitor system is coupled to the portion of the ADC by a fourth switch system comprising one or more switches.

11. The method of claim 10, further comprising:
holding each switch of the first switch system and the fourth switch system closed while concurrently holding each switch of the second switch system and the third switch system open; and holding each switch of the second switch system and the third switch system closed while concurrently holding each switch of the first switch system and the fourth switch system open.

12. The method of claim 10, wherein:
each switch of the second switch system and the fourth switch system is directly connected to a differential amplifier of the ADC.

13. The method of claim 8, further comprising:
storing a first intermediate result from a differential amplifier of the ADC in the first capacitor system; and
storing a second intermediate result from a differential amplifier of the ADC in the second capacitor system.

14. The method of claim 8, further comprising:
coupling a digital to analog converter (DAC) to the first capacitor system for at least a portion of a first time period in which the ADC converts the first amount of charge stored by the first capacitor system to the second digital value; and
coupling the DAC to the second capacitor system for at least a portion of a second time period in which the ADC converts the second amount of charge stored by the second capacitor system to the first digital value.

15. An apparatus, comprising:
a capacitive touch sensor comprising a plurality of nodes; and
a control unit coupled to the capacitive touch sensor, the control unit comprising:
a first capacitor system and a second capacitor system, each capacitor system comprising one or more capacitors, each capacitor system removably coupled to the same portion of an analog to digital converter (ADC) and at least one node of the capacitive touch sensor, each capacitor system configured to store an amount of charge received through the at least one node when coupled to the at least one node, and provide the amount of charge received through the at least one node to the ADC for conversion into a digital value when coupled to the ADC;
a timing circuit configured to generate one or more control signals; and
a switching circuit configured to:
receive the one or more control signals;
when the one or more control signals are in a first state, couple the first capacitor system to the at least one node to receive charge through the at least one node and concurrently couple the second capacitor system to the portion of the ADC; and
when the one or more control signals are in a second state, couple the second capacitor system to the at least one node to receive charge through the at least one node and concurrently couple the first capacitor system to the portion of the ADC.

16. The apparatus of claim 15, wherein:
the amount of charge is indicative of a capacitance of the at least one node of the capacitive touch sensor.

17. The apparatus of claim 15, the switching circuit comprising:
a first switch system comprising one or more switches operable to couple the first capacitor system to the at least one node;
a second switch system comprising one or more switches operable to couple the first capacitor system to the portion of the ADC;
a third switch system comprising one or more switches operable to couple the second capacitor system to the at least one node; and
a fourth switch system comprising one or more switches operable to couple the second capacitor system to the portion of the ADC.

18. The apparatus of claim 17, wherein the switching circuit is configured to:
hold each switch of the first switch system and the fourth switch system closed while concurrently holding each switch of the second switch system and the third switch system open; and
hold each switch of the second switch system and the third switch system closed while concurrently holding each switch of the first switch system and the fourth switch system open.

19. The apparatus of claim 17, wherein:
each switch of the second switch system and the fourth switch system is directly connected to a differential amplifier of the ADC.

20. The apparatus of claim 15, wherein:
the first capacitor system and the second capacitor system are each operable to store an intermediate result from a differential amplifier of the ADC.

21. The apparatus of claim 15, further comprising:
a digital to analog converter (DAC) that is removably coupled to the first capacitor system and the second capacitor system, the DAC configured to be coupled to:
the first capacitor system for at least a portion of a first time period in which the ADC converts charge stored by the first capacitor system to the first digital value; and
the second capacitor system for at least a portion of a second time period in which the ADC converts charge stored by the second capacitor system to the second digital value.

\* \* \* \* \*